United States Patent [19]

Ahlgren

[11] Patent Number: 4,985,281
[45] Date of Patent: Jan. 15, 1991

[54] ELEMENTAL MERCURY SOURCE FOR METAL-ORGANIC CHEMICAL VAPOR DEPOSITION

[75] Inventor: William L. Ahlgren, Goleta, Calif.

[73] Assignee: Santa Barbara Research Center, Goleta, Calif.

[21] Appl. No.: 434,652

[22] Filed: Nov. 9, 1989

Related U.S. Application Data

[62] Division of Ser. No. 234,722, Aug. 22, 1988, Pat. No. 4,901,670.

[51] Int. Cl.$^5$ ............................................. C23C 16/00
[52] U.S. Cl. .................................... 427/248.1; 118/500; 118/725; 118/726; 118/728; 156/613; 156/614; 156/DIG. 82; 427/250; 427/255.2
[58] Field of Search ............... 118/500, 725, 726, 728; 156/613, 614, DIG. 72, DIG. 82, DIG. 92; 427/248.1, 250, 255.2; 219/271, 273, 275

[56] References Cited

U.S. PATENT DOCUMENTS

| | | | |
|---|---|---|---|
| 4,144,116 | 3/1979 | Jacob et al. | 156/614 |
| 4,172,756 | 10/1979 | Hollan | 156/614 |
| 4,645,689 | 2/1987 | Cox | 427/255.2 |
| 4,716,130 | 12/1987 | Johnston, Jr. et al. | 156/613 |
| 4,808,551 | 2/1989 | Mori et al. | 156/614 |

FOREIGN PATENT DOCUMENTS 58-132921 8/1983 Japan .................................. 156/614

OTHER PUBLICATIONS

Marinace, J. C., "Extremely Thin Epitaxial Germanium Layers on Gallium Arsenide", IBM Technical Disclosure Bulletin, vol. 5, No. 8 (Jan. 1983), p. 85.

Primary Examiner—Norman Morgenstern
Assistant Examiner—Terry J. Owens
Attorney, Agent, or Firm—W. C. Schubert; W. K. Denson-Low

[57] ABSTRACT

Apparatus and method for supplying elemental mercury to a MOCVD reactor during the operation of the reactor and for maintaining a saturated mercury vapor atmosphere over a surface of a substrate. A susceptor assembly 10 includes a susceptor 20 having a surface for supporting a substrate 22 within a growth chamber. A reservoir 34 of liquid mercury 36 is disposed external to the reactor and supplies liquid mercury via a capillary feed tube 30 to a depression or trough 24 formed within a surface of the susceptor at an upstream position from the substrate. Mercury within the trough is vaporized by the heated susceptor and flows over the substrate, thereby establishing a saturated mercury atmosphere over the substrate. The reservoir may be pressurized by a source of gas or its vertical position may be adjusted to provide a gravity feed of the mercury.

8 Claims, 3 Drawing Sheets

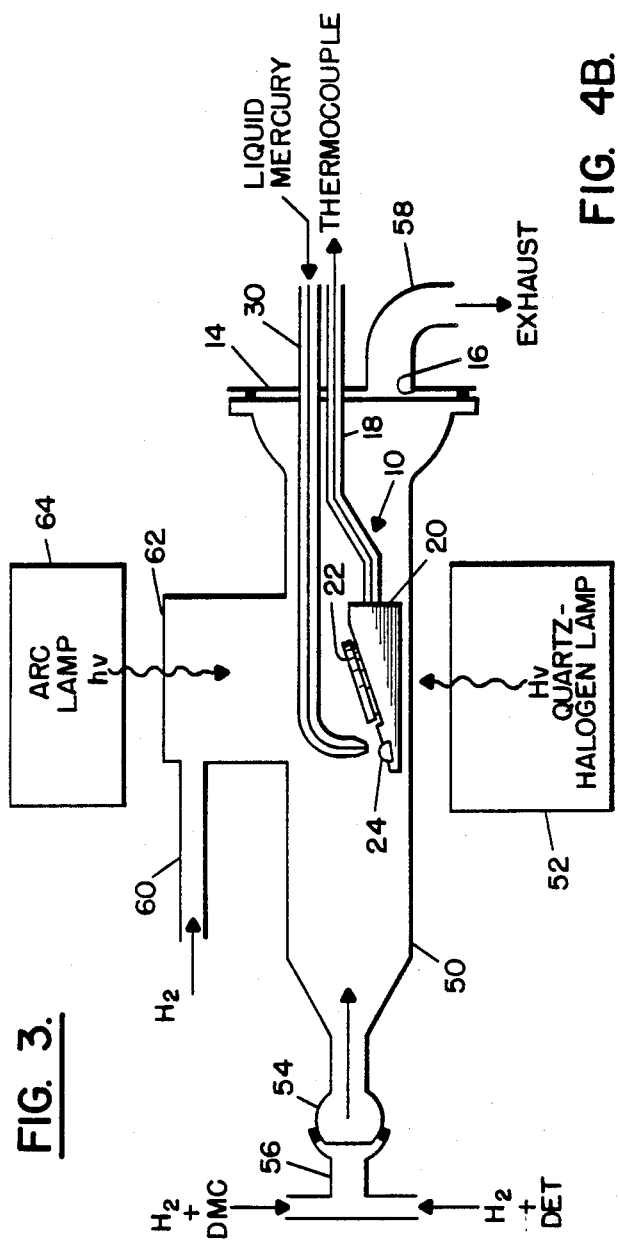
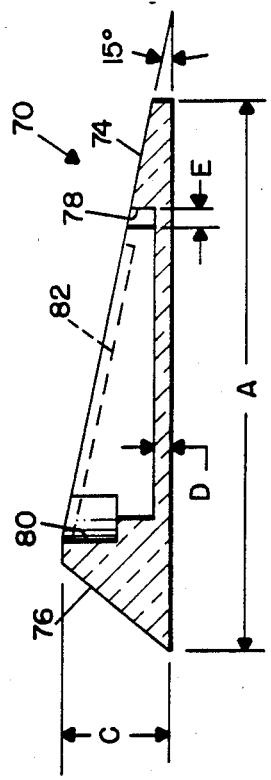
FIG. 3.
FIG. 4B.

ELEMENTAL MERCURY SOURCE FOR METAL-ORGANIC CHEMICAL VAPOR DEPOSITION

This is division of application Ser. No. 234,722, filed Aug. 22, 1988, U.S. Pat No. 4,902,670.

FIELD OF THE INVENTION

This invention relates generally to Metal-Organic Chemical Vapor Deposition (MOCVD) apparatus and method and, in particular, is related to an elemental mercury (Hg) source for MOCVD which includes a reservoir of mercury which is disposed external to an MOCVD reactor, a mercury feed apparatus for introducing liquid mercury into the reactor and a heated susceptor adapted to receive the liquid mercury and to distribute vaporized mercury to a substrate upon which deposition of the mercury is desired.

BACKGROUND OF THE INVENTION

Conventional elemental mercury sources for MOCVD typically include an open container, such as a dish, of mercury disposed upstream from a susceptor, the susceptor having a substrate disposed thereon. One zone of a furnace is employed to heat and vaporize the mercury while a separate, independent zone is used to heat the susceptor. In order to prevent the condensation of the vaporized mercury as it passes from the first to the second zone the walls of the MOCVD reactor are typically heated.

As can be appreciated, the disadvantages of such conventional MOCVD systems are several. Firstly, it has been found that the maintenance of a Hg-saturated atmosphere over the substrate requires a large mercury consumption rate. Secondly, as previously mentioned, the walls of the MOCVD reactor must be heated because the mercury container is remote from the substrate and is disposed within a separate, independent zone of the furnace. Thirdly, inasmuch as the reactor must consequently contain such a two zone furnace the design of the reactor is complicated and the flexibility of the reactor to readily accommodate configuration changes is compromised. And fourthly, inasmuch as the container of mercury is located within the MOCVD reactor during a growth run, the mercury within the container is not readily replenished. This results in a "skin" or coating of mercury compounds forming upon the surface of the liquid mercury within the container. This coating often interferes with the vapor transport of the mercury from the container to the atmosphere of the reactor.

SUMMARY OF THE INVENTION

The foregoing problems are overcome and other advantages are realized by an elemental mercury source for a MOCVD reactor which is constructed and operated in accordance with the invention. There is disclosed apparatus and method for supplying elemental mercury to a MOCVD reactor during the operation of the reactor and for maintaining a saturated mercury vapor atmosphere over a surface of a substrate. A susceptor assembly includes a susceptor having a surface for supporting at least one substrate within a growth chamber. A reservoir of liquid mercury is disposed external to the reactor and supplies liquid mercury via a feed tube to a depression or trough formed within a surface of the susceptor. Mercury within the trough is vaporized by the heated susceptor and the vapor flows over the substrate, thereby establishing a saturated mercury atmosphere over the substrate. The reservoir may be pressurized by a source of gas or the vertical position of the reservoir may be adjusted to provide a gravity feed of the mercury.

In accordance with one aspect of the invention there is disclosed a susceptor for use in a metal-organic chemical vapor deposition reactor. The susceptor comprises a body comprised of a refractory material, the body having a surface for supporting at least one substrate and a region formed within the body, the region defining a volume for containing therein a quantity of liquid mercury.

In accordance with another aspect of the invention there is disclosed a susceptor assembly for use in a metal-organic chemical vapor deposition reactor. The susceptor assembly comprises a body comprised of a refractory material, the body having a surface for supporting at least one substrate; a region formed within the body, the region defining a volume for containing therein a quantity of liquid mercury; and means for feeding the liquid mercury to the region.

In accordance with still another aspect of the invention there is disclosed apparatus for providing elemental liquid mercury to a chamber wherein the deposition of a mercury compound upon a substrate is accomplished. The apparatus includes means for supporting a substrate within a chamber during the deposition of a mercury compound thereon, the supporting means comprising means for holding a quantity of liquid mercury; means, external to the chamber, for storing a supply of liquid mercury; and means for transporting liquid mercury from the storing means to the holding means.

In accordance with a method of the invention there is disclosed a method of providing a source of elemental mercury for the growth of a mercury compound upon a substrate. The method comprises the steps of providing a substrate within a reactor, the substrate being disposed upon a heated substrate support; providing a reservoir of elemental liquid mercury external to the reactor; transporting elemental liquid mercury from the reservoir to the substrate support whereby the mercury is vaporized; and directing the mercury vapor to flow over the substrate such that a saturated mercury atmosphere is maintained over a surface of the substrate.

BRIEF DESCRIPTION OF THE DRAWING

These and other aspects of the invention will be made more apparent in the following Detailed Description of the Invention read in conjunction with the accompanying drawing, wherein:

FIG. 3 is a side cutaway view of a MOCVD reactor having the susceptor assembly 10 of FIG. 1 or 2 installed therein.

FIG. 4b is a side, cut-away view of the susceptor of FIG. 4a; and

DETAILED DESCRIPTION OF THE INVENTION

Figure 1:
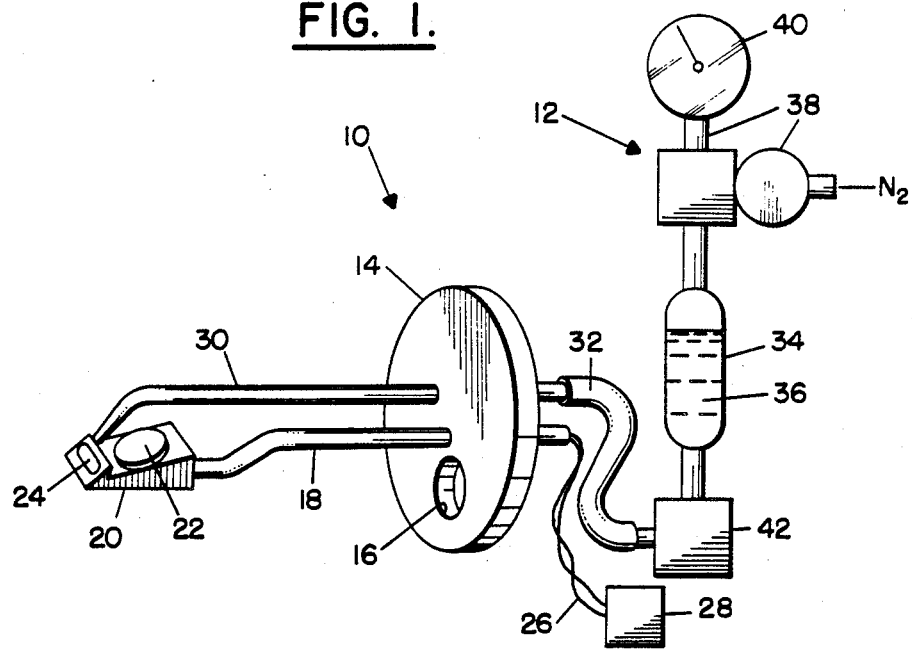
FIG. 1 is an elevational view of a susceptor assembly 10 coupled to a pressurized elemental liquid mercury feed system 12.

Referring now to FIG. 1 there is shown a susceptor assembly 10 coupled to an elemental mercury pressure feed system 12. Susceptor assembly 10 comprises a flange 14 having a plurality of openings made therethrough, such as an opening 16 which may provide for an exhaust port (shown in FIG. 3). Flange 14 has an opening through which passes a susceptor support 18 which supports at a terminal end thereof a susceptor 20. Susceptor support 18 may be comprised of a quartz tube or any suitable refractory material which is operable for supporting the susceptor 20 and which, furthermore, may permit the passage of conductors, such as wires 26, which emanate from a susceptor heat sensing means (not shown). Wires 26 may be connected to a familiar thermocouple which is in thermal contact with the susceptor 20, the wires further being coupled at an opposite end thereof to a susceptor temperature control means 28. Susceptor 20 is comprised, preferably, of graphite or of any suitable refractory material. By illustration there is shown disposed upon the susceptor 20 a substrate 22 whereon the growth of a mercury film or a mercury compound is desired. It can be appreciated that the substrate 22 does not form a part of the susceptor assembly and is shown only for illustrative purposes. In accordance with one aspect of the invention susceptor 20 is provided with a region suitable for holding a supply of liquid mercury, such as a depression or trough 24 which is formed within an end of the susceptor 20.

It should be noted that as used herein the term "susceptor" includes any type of substrate support which is capable of operation at elevated temperatures. As such, the susceptor may be heated inductively, resistively, radiatively or by any suitable method whereby the substrate 22 is maintained at a desired temperature suitable for performing a MOCVD growth process. It should also be noted that the susceptor may have a number of suitable shapes, such as a flat top surface or an inclined top surface for supporting one or more substrates thereon.

In accordance with the invention there is disposed above the trough 24 a terminal end of an elemental mercury supply tube 30. Supply tube 30 may comprise a capillary pyrex tube having an inside diameter within a range of approximately 0.005 inches to 0.015 inches. The supply tube 30 also passes through the flange 14 and is coupled at an opposite end thereof to the pressurized mercury supply system 12. Supply tube 30 may be coupled to the supply system 12 by means of a TELFON tube 32 or by any suitable fluid coupling means.

In accordance with one embodiment of the invention supply system 12 comprises a pressurized reservoir 34 of liquid mercury 36 which is mounted external to the MOCVD reactor (not shown in FIG. 1). The reservoir 34 is pressurized, typically between 0-15 psig, with a source of, for example, nitrogen gas, the pressure being controlled by a needle valve assembly 38. A pressure gauge 40 may be provided for monitoring the pressure of the system 12. The reservoir 34 also communicates with a shut-off valve 42 which supplies the pressurized liquid mercury through the tubes 32 and 30 to the trough 24 which is positioned beneath the inner terminal opening of tube 30. Shut-off valve 42 may comprise TEFLON and PYREX or any material suitable for contact with the liquid mercury.

During operation in an MOCVD reactor the mercury so provided to the trough 24 is heated by contact with the heated susceptor 20 and vaporizes, the vaporized mercury being carried over the substrate 22 by a flow of carrier gas within the reactor. This mercury vapor provides for a saturated mercury vapor atmosphere over the substrate 22. As can readily be seen in the embodiment shown in FIG. 1 the source of mercury vapor is integral with the susceptor 20 upon which the substrate 22 is mounted. This provides for the establishment of saturated mercury vapor atmosphere over the substrate with a minimum mercury source consumption. The walls of the reactor are not required to be heated since they are not contacted by the mercury vapor between the source, or trough 24, and the substrate 22. This results in a simplification of reactor design and increases reactor flexibility. For example, the use of the invention allows for the incorporation of purged windows for photo-assisted MOCVD as is shown and will be described in relation to FIG. 3.

Figure 2:
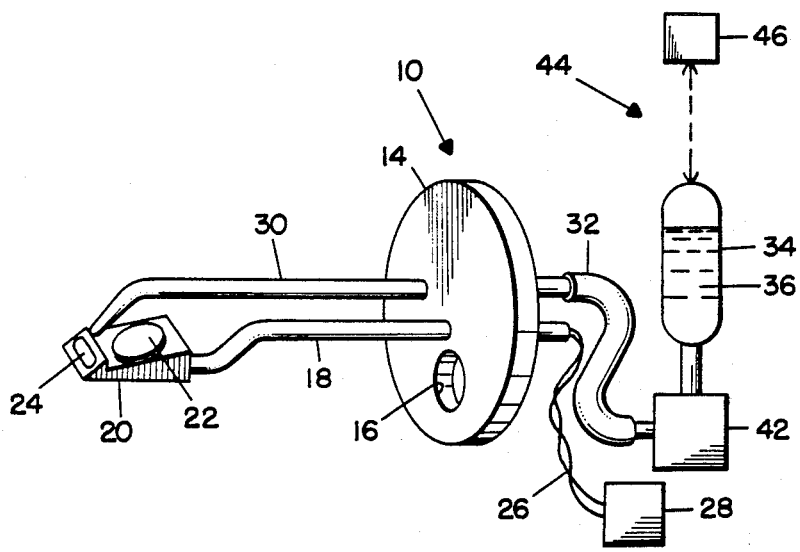
FIG. 2 is an elevational view of the susceptor assembly 10 coupled to a gravity feed elemental liquid mercury feed system 44.

Referring now to FIG. 2 there is shown an alternate embodiment of the invention which employs a relatively large bore mercury supply tube 30 in conjunction with a gravity feed system 44 for supplying mercury from the reservoir 34. In the embodiment of FIG. 2 the valve 38 and gauge 40 of FIG. 1 are eliminated. The elemental mercury 36 is instead fed from reservoir 34 by, preferably, adjusting with a positioning means 46 the height of the reservoir 34 relative to the opening within the terminal end of supply tube 30 to provide for a desired pressure head of the mercury.

Referring now to FIG. 3 there is illustrated the susceptor assembly 10 of either FIGS. 1 or 2 installed within an MOCVD reactor 50. The susceptor assembly 10 will be described in the context of a purged window, photo-assisted MOCVD system wherein the susceptor 20 is heated by ultraviolet (UV) radiation from a quartz-halogen source 52. Furthermore, the MOCVD reactor will be described as a reactor for performing deposition of Group II-VI material upon a substrate, particularly, the deposition of $Hg_{(1-x)}Cd^xTe$ semiconductor material. It should be realized however that the susceptor assembly 10 of the invention is applicable to a variety of MOCVD reactor types. Also, the use of the invention is applicable to the deposition of other types of mercury alloys than those disclosed in this illustrative embodiment.

Reactor 50 may be comprised of quartz or any suitable refractory material. Coupled to a downstream end of reactor 50 via an input coupler 54 is a gas mixing region 56 wherein a flow of a carrier gas, typically $H_2$, is provided. Alternatively, helium, argon, nitrogen or any known carrier gas may be employed. One stream of carrier gas may comprise dimethyl cadmium (DMC) molecules while another stream of carrier gas may comprise diethyl tellurium (DET) molecules. The two gas streams are mixed in the region 56 and flow, via input coupler 54, into reactor 50 and over susceptor 20 and the substrate 22 disposed thereon. The gas is exhausted through an exhaust port 58 which is made through the opening 16 within flange 14. Another stream of, for example, $H_2$ may be provided through input coupler 60 such that this stream of gas flows over and purges a window 62. That is, this flow of $H_2$ prevents the deposition of source material upon the window 62. The window 62 is substantially transparent to radiation from a UV source 64, the UV radiation being selected to have a range of wavelengths most optimum for decomposing the DMC and DET molecules within the region of the substrate 22. For example, the source 64 may be a mercury-xenon arc lamp which comprises a dichroic mirror for restricting the output of the source 64 to the range of wavelengths of 200 to 250 nanometers. After decomposition the cadmium and tellurium atoms combine with mercury atoms provided by the mercury vapor from trough 24, thereby depositing an alloy or compound having the desired Group II-VI composition upon the substrate 22.

In accordance with the invention, elemental liquid mercury is fed through supply tube 30 to the heated susceptor 20 where the mercury is contained within the trough 24. The flow rate of the mercury is adjusted such that, preferably, the trough is kept substantially full of mercury during the growth run. That is, the flow rate is adjusted such that the mercury which is lost to vaporization and which is carried over the substrate 22 is continuously replaced by mercury from the supply tube 30. The flow rate may be adjusted simply by viewing the mercury within the trough 24 and manually opening the valve 42 (FIG. 1) at appropriate intervals to replenish the mercury within the trough 24. Alternatively, the system may be calibrated, based upon a particular susceptor temperature and other factors which influence the rate of vaporization of the mercury, to add a predetermined amount of mercury at predetermined intervals. For example, the system may be calibrated to add 0.1 grams of mercury to the trough 24 every ten minutes. In this regard a suitable controller, such as a microcomputer, may be coupled to the MOCVD system via well known digitally actuated flow controllers, valves or other types of effectors to regulate and vary the pressure of the system of FIG. 1 or to adjust the height of the reservoir 34 of FIG. 2, thereby adjusting and controlling the flow rate of the mercury to the susceptor 20. In regards to the embodiment shown in FIG. 2 the reservoir 34 is coupled to the positioning means 44 which may be a well known linear actuator. The positioning means may otherwise comprise, for example, a pulley and cable driven by a motor such as a stepper motor. Either of these means are suitable for varying the height of the reservoir relative to the terminal end of supply tube 30 and hence the magnitude of the pressure head of the reservoir 34.

Figure 4A:
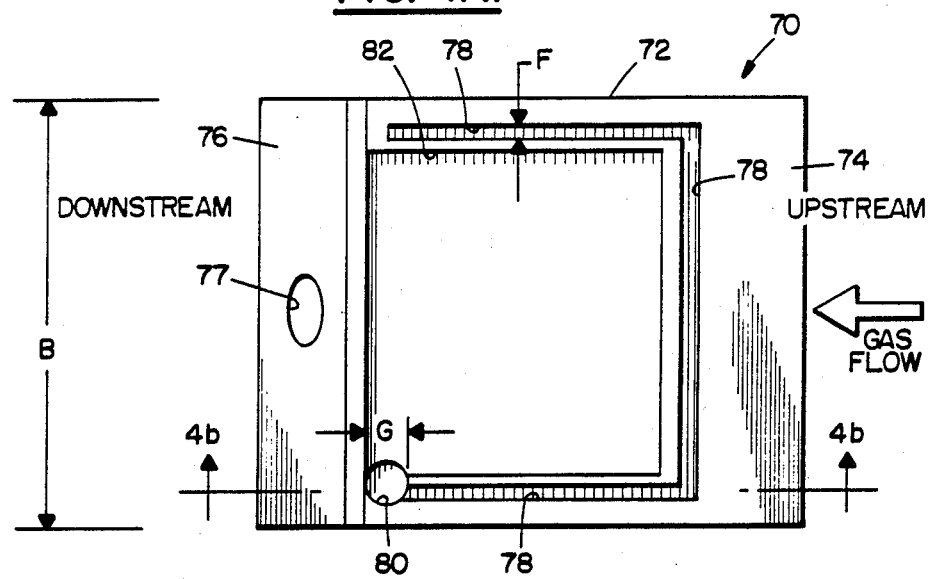
FIG. 4a is a top View showing a susceptor constructed in accordance with the invention.

Inasmuch as liquid mercury has a high surface tension it can be appreciated that the aspect ratio and the volume of the trough 24 are considerations in the implementation of a susceptor assembly 10 constructed and operated in accordance with the invention. Referring to FIGS. 4a and 4b there is shown one embodiment of a susceptor 70 having a generally wedged shape and a liquid mercury trough which surrounds a substrate support area on three sides. Susceptor 70 includes a body 72 of refractory material having a sloping major top surface 74 and a sloping rear surface 76. The rear surface 76 is provided with an opening 77 wherein a susceptor support (not shown) is attached. A trough 78 includes a feed area 80 wherein liquid mercury is supplied. A relatively shallow depression which defines a substrate support surface 82 is surrounded on three sides by the trough 78, thereby ensuring a uniform saturated Hg vapor over a substrate. Due to the wedge shape of the susceptor 70 the depth of the trough 78 varies from a downstream portion to an upstream portion. In general, where the trough 78 is of minimum depth, at the upstream portion, the depth of the trough is at least twice as deep as it is wide. The feed area 80 opening is provided at a downstream position such that the mercury feed tube (not shown) does not perturb the gas flow over the substrate.

Representative dimensions of the susceptor 70 are shown below.

| DESIGNATOR | DIMENSION (INCH) |
|---|---|
| A | 2.25 |
| B | 1.75 |
| C | 0.5 |
| D | 0.062 |
| E | 0.062 |
| F | 0.031 |
| G | 0.125 |

Figure 5:
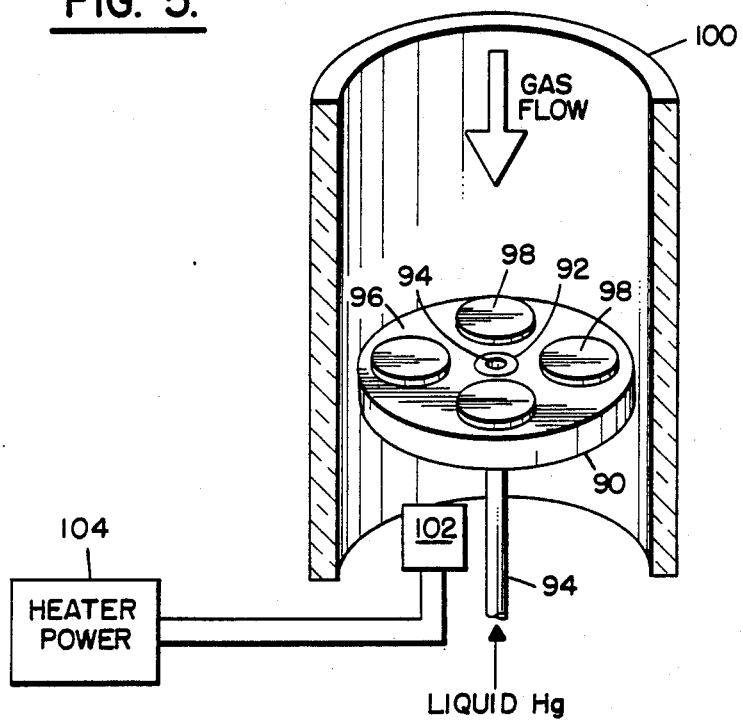
FIG. 5 is a cut-away view of a MOCVD reactor having a disk-shaped susceptor constructed in accordance with the invention.

Referring now to FIG. 5 there is shown, in accordance with another embodiment of the invention, a disk shaped susceptor 90 having a centrally disposed region 92, such as a depression, wherein liquid mercury is fed from below by a supply tube 94 which passes through the susceptor. A top surface 96 of the susceptor 90 provides for supporting a plurality of substrates 98 during the growth of mercury containing layers thereon. Susceptor 90 is shown within a substantially circular cylindrical vertical growth tube 100 having a flow of gas which impinges on the region 92. A heating element 102 is coupled to a source of heater power 104 for heating the susceptor 90. Liquid mercury fed to the region 92 is vaporized by contact with the heated susceptor 90, the vapor being conveyed over the top surface 96, and the substrates 98, by the gas flow.

It should be realized that the susceptor 90 may be heated by a resistive heating element or may be inductively heated. Alternatively, the tube 100 may be provided with one or more windows for heating the susceptor with an external source of radiation. The liquid mercury fed to the region is preferably provided from an external reservoir, as shown in FIGS. 1 and 2.

Based on the foregoing description of the invention it can be appreciated that the invention overcomes the aforedescribed deficiencies of conventional MOCVD systems and also provides additional benefits. By providing the elemental mercury source in close proximity to the substrate 22, particularly upon the susceptor itself, there is little or no opportunity for the mercury vapor to condense on the side walls of the reactor, thus eliminating the requirement to heat the side walls. Furthermore, a two zone furnace system is not required in that, in accordance with the invention, the elemental mercury is provided to the same zone wherein the susceptor and substrate are heated. Also, due to the close proximity of the vapor source to the substrate, mercury source consumption rates are significantly reduced over conventional MOCVD systems. Furthermore, MOCVD may be carried out at lower temperatures or within a range of temperatures from approximately room temperature, where some vapor pressure of mercury is present, up to the boiling point of mercury, or approximately 357° C. at one atmosphere of pressure (760 Torr). The MOCVD growth temperatures with a saturated mercury atmosphere made possible by the invention readily accommodate a range of temperatures within the range of approximately 180° C. to 315° C. Lower temperature growth, such as approximately 180° C., may be preferred for some applications in that mercury source consumption is reduced and, importantly, mercury vacancy concentration within epitaxial layers grown upon the substrate 22 is reduced. For example, the mercury source of the invention has been employed to grow Hg(1−x)Cd$_x$Te alloys and also HgCd/CdTe superlattices under saturated Hg conditions at temperatures within the range of 182° C. to 315° C.

It should be pointed out that the MOCVD systems shown in FIGS. 3 and 5 are illustrative only and are not intended to limit the use of the invention to only such purged window, photo-assisted or vertical MOCVD systems. Also, the description of the invention as related to the Figures is not intended to be read in a limiting sense. In that those having ordinary skill in the art may derive modifications to the presently preferred embodiments of the intention as shown and described above the invention is not intended to be limited to these presently preferred embodiments or to the illustrative examples given above. The invention is instead intended to be limited only as defined by the appended claims.

Wht is claimed is:

1. In a metal-organic chemical vapor deposition system having a reactor, a method of providing a source of elemental mercury for the growth of a mercury compound upon a substrate, comprising the steps of:
   providing a substrate within the reactor, the substrate being disposed upon a heated substrate support;
   providing a reservoir of elemental liquid mercury external to the reactor;
   transporting elemental liquid mercury from the reservoir to the substrate support whereby the mercury is vaporized; and
   directing the mercury vapor to flow over the substrate such that a saturated mercury atmosphere is maintained over a surface of the substrate.

2. A method as defined in claim 1 wherein the step of transporting is accomplished by the steps of:
   pressurizing the reservoir to a predetermined pressure; and
   flowing the pressurized liquid mercury from the reservoir to the substrate support.

3. A method as defined in claim 1 wherein the step of transporting is accomplished by the steps of:
   elevating the reservoir relative to the substrate support for developing a desired pressure head within the reservoir; and
   flowing the liquid mercury from the reservoir to the substrate support.

4. A method as defined in claim 1 wherein the substrate support is heated to a temperature within the range of approximately 180° C. to approximately the boiling point of mercury.

5. A method as defined in claim 2 wherein the step predetermined pressure is within a range of approximately zero to approximately 15 psig.

6. A method as defined in claim 1 wherein the step directing is accomplished by providing a carrier gas flow through the reactor, the carrier gas flow comprising molecules which are desired to be alloyed with the mercury.

7. A method as defined in claim 6 wherein the molecules comprise atoms belonging to selected Group II-IV elements.

8. A method as defined in claim 6 wherein the carrier gas flow comprises dimethyl cadmium and diethyl tellurium.

* * * * *